United States Patent [19]

Sterner

[11] 4,031,465

[45] June 21, 1977

[54] SCR, DIODE, DIAC, AND TRIAC TESTER

[75] Inventor: John Franklin Sterner, Piscataway, N.J.

[73] Assignee: RCA Corporation, New York, N.Y.

[22] Filed: Dec. 23, 1974

[21] Appl. No.: 535,812

[52] U.S. Cl. .................... 324/158 SC; 324/158 D
[51] Int. Cl.[2] ................................. G01R 31/22
[58] Field of Search ..... 324/158 SC, 158 T, 158 D, 324/73 R

[56] References Cited

UNITED STATES PATENTS

| | | | |
|---|---|---|---|
| 3,206,675 | 9/1965 | Brunetto | 324/158 SC |
| 3,214,673 | 10/1965 | Cock | 307/318 |
| 3,478,264 | 11/1969 | Tsergas | 324/158 SC |

OTHER PUBLICATIONS

Grafham, D. R.; "How to Measure . . . "; Radio-Electronics; Jan. 1966, pp. 48, 50, 52.

*Primary Examiner*—Rudolph V. Rolinec
*Assistant Examiner*—Ernest F. Karlsen
*Attorney, Agent, or Firm*—H. Christoffersen; Samuel Cohen; William Squire

[57] ABSTRACT

A tester is provided in which a test signal having a selected polarity and magnitude is applied across the main electrodes of a device under test. In the case of an SCR device under test, for example, pulses of a predetermined energy level and polarity are applied to the gate electrode to trigger the SCR into conduction. The tester operates to identify the anode and cathode terminals of the conducting device, as well as to determine without destructive failure of the device under test whether the device is open, shorted or exhibiting leakage.

7 Claims, 1 Drawing Figure

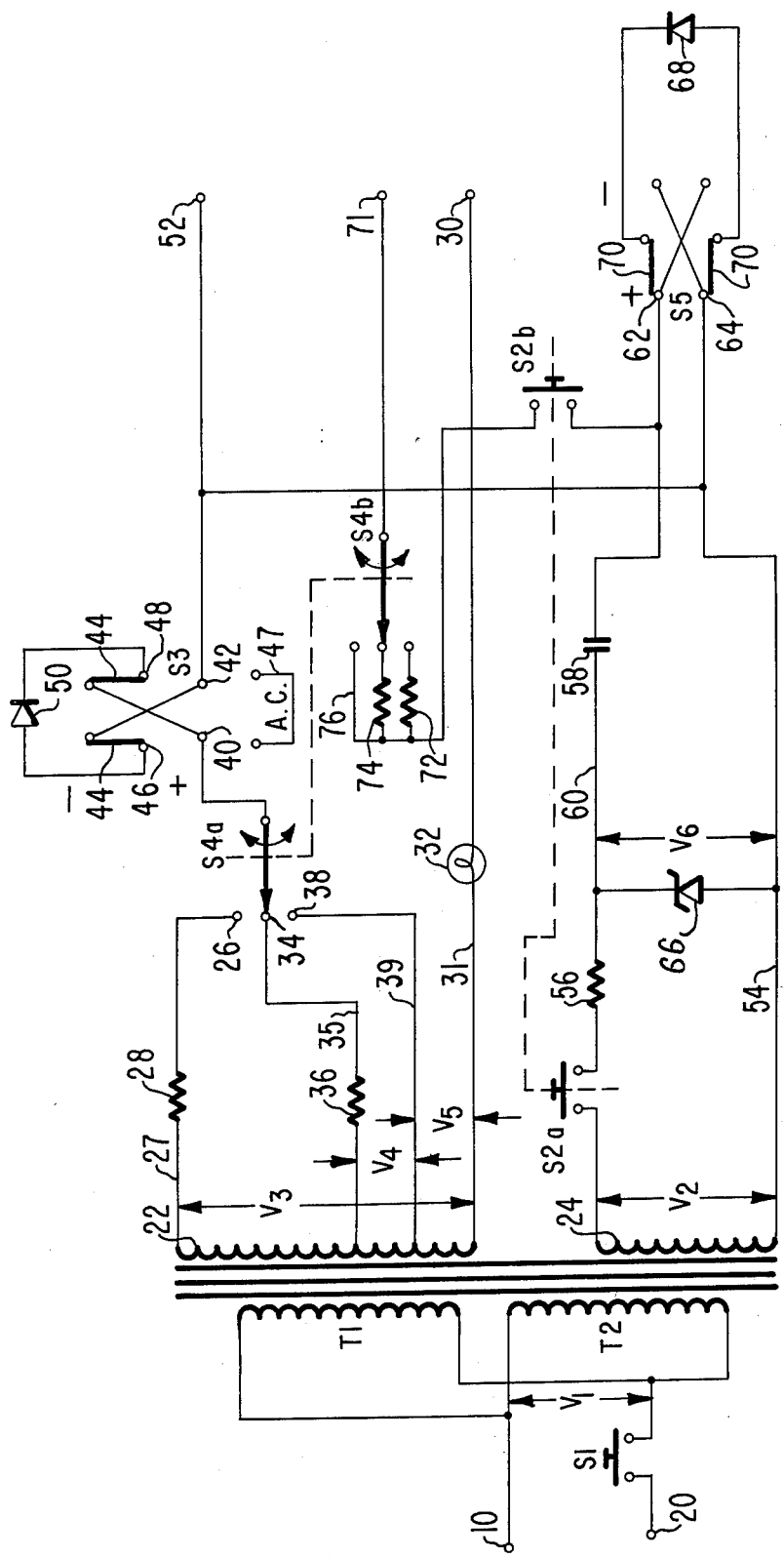

SCR, DIODE, DIAC, AND TRIAC TESTER

FIELD OF THE INVENTION

The present invention relates to a tester capable of non-destructively testing semiconductor devices such as SCRs, Diacs, diodes and Triacs.

DESCRIPTION OF THE PRIOR ART

In the testing of semiconductor SCR devices and the like, prior art testers apply a triggering signal or pulse to the gate electrode for turning on the device. However, when the polarity of the device and the power dissipating ability of the device are unknown, prior art testers tend to provide excessive power to electrodes of the device under test, destructively failing the device. Since the various devices to be tested have an unknown internal impedance, prior art testers tend to cause devices with relatively low internal impedance to draw excessive current burning out the device which otherwise might have been in acceptable condition. A tester of the type with which the present invention is concerned should be able to identify not only the polarity of the electrodes of various devices under test whose characteristics are unknown, but also whether or not the devices meet or exceed certain minimum characteristics without destructive failure of the devices.

SUMMARY OF THE INVENTION

A tester for thyrister semiconductor devices having two main electrodes and a control electrode includes first, second, third terminals adapted to be connected respectively to the main electrodes and the control electrode, and to a power source.

First switch means are connected between the source and the first and second terminals for selectively setting the value and the polarity of electrical energy provided from the source to the first and second terminals. Second switch means connect the source with the third terminal to determine selectively the polarity and value of electrical energy provided from the source to the third terminal. Indicating means are connected with the first and second terminals to indicate the presence of current flow upon the first and second switch means being set to provide a value and polarity of the electrical energy to the terminals according to the acceptable operating parameters of the particular device under test. The absence of the indication upon the switch means being set to provide the last-mentioned value and polarity of the electrical energy to the terminals indicates a failed device.

The sole FIGURE in the drawing is a schematic representation of a circuit constructed and operated in accordance with one embodiment of the present invention.

DETAILED DESCRIPTION

Suitable alternating current voltage $V_1$ is applied between terminals 10 and 20 as, for example, 110 volts A.C. from a common household supply source. Terminals 10 and 20 are connected in parallel to the primary windings of transformers T1 and T2. Terminal 20 is connected to the transformers T1 and T2 through a switch $S_1$. One end of secondary winding 22 is connected to a switch terminal 26 by lead 27 through a current limiting resistance 28. The other end of winding 22 is connected to a terminal 30 along lead 31 through an indicating light bulb 32. Switch terminal 34 is connected to a first tap on winding 22 by lead 35 through a current limiting resistance 36. Switch terminal 38 is connected to a second tap on winding 22 by a lead 39. The voltage $V_3$ between leads 27 and 31 represents the full voltage available from the voltage source $V_1$ at the secondary winding 22. Voltage $V_4$ between leads 35 and 31 is preferably about 35 volts. Voltage $V_5$ between leads 31 and 39 is preferably about 6.3 volts.

Terminals 26, 34 and 38 are selectively connected to a terminal 40 by the setting of the switch $S_{4a}$. Terminal 40 is connected to terminal 42 by the setting of the switch $S_3$. Switch $S_3$ is a three position slide switch. In a first position switch $S_3$ connects terminal 40 to terminal 42 by the slider 44 placing a lead 47 directly between the terminals 40 and 42. In a second position, as shown in the drawing, slider 44 connects terminals 40 and 42 to terminals 48 and 46, respectively. Connected between terminals 46 and 48 is a diode 50 whose anode is connected to terminal 46. In this latter switch position, terminal 46 is directly connected to terminal 42 and terminal 48 is directly connected to terminal 40. As a result, diode 50 rectifies the negative portion of the A.C. signal applied to terminal 40 so that only negative pulses appear at terminal 42. In the third position, slider 44 directly connects terminal 46 to terminal 40 and terminal 48 directly to terminal 42. In this position, the positive portion of the A.C. signal applied to terminal 40 is rectified by diode 50. As a result, either an A.C. signal at a voltage amplitude of $V_3$, $V_4$ or $V_5$ as selected by switch $S_{4a}$ or the negative or positive cycles thereof as rectified by diode 50 appears at terminal 42 in accordance with switch position of slider 44.

Terminal 42 of switch $S_3$ is directly connected to terminal 52. Terminal 42 is also directly connected to lead 54 which is connected to one end of secondary winding 24 of the transformer T2. The other end of winding 24 is connected through a pushbutton switch $S_{2a}$, resistance 56 and capacitor 58 along lead 60 to a terminal 62 of a switch $S_5$. Lead 54 is connected to a terminal 64 of the switch $S_5$. Connected at the junction of resistance 56 and capacitor 58 is the cathode of a Zener diode 66 whose anode is connected to lead 54. Terminals 62 and 64 are connected by the switch $S_5$ to a diode 68. Switch $S_5$ serves to reverse the direction of current flow through diode 68 by way of slider 70. In the position of the switch $S_5$ shown, terminal 62 is directly connected to the cathode of the diode 68, while terminal 64 is directly connected to the anode of the diode 68. In the other switch position, slider 70 directly connects terminal 62 to the anode of diode 68 and the cathode of diode 68 directly to terminal 64.

Switch $S_{4b}$ selectively connects terminal 71 to either lead 76, resistance 72 or resistance 74 through a pushbutton switch $S_{2b}$ to the junction of terminal 62 and capacitor 58. Resistances 74 and 72 are scaled current limiting resistances. In the alternative, capacitances may be used in place of resistances 72 and 74 to reduce the energy applied between the terminals 52 and 71. Terminals 52, 71 and 30 respectively receive the cathode, gate and anode electrodes of SCR thyristors. In the alternative, terminals 52 and 30 receive the electrodes of diodes or diacs. Triacs may also be connected to terminals 52, 30 and 71 in a manner similar to that of SCRs.

Switches $S_{2a}$ and $S_{2b}$ are ganged together as shown by a dotted connecting line, while switches $S_{4a}$ and $S_{4b}$ are ganged together as shown by a dotted connecting line. Switch $S_1$ is the power on and off switch, switches $S_{2a}$ and $S_{2b}$ and $S_{4a}$ and $S_{4b}$ are the test mode operating switches. Switches $S_3$ and $S_5$ include sliders 44 and 70, respectively, which are placed in a predetermined position in accordance with the type of test being conducted corresponding to the device under test. When the device under test is connected between terminals 52 and 30, any conduction that takes place between these terminals through the device will be shown by the indicator bulb 32. In certain instances, as will be shown, the bulb 32 should light providing a given indication of conduction in an accept mode, and in other instances, if the bulb 32 lights, it indicates a short and a failure condition. Under certain conditions, whether the bulb 32 lights or does not light provides a determination of the polarity of the device under test.

As provided in accordance with the present invention, Zener diode 66 limits the voltage applied to capacitor 58 to the magnitude $V_6$ which is preferably about 5 volts. This voltage is essential to the present invention in that it is sufficient to trigger all known SCR devices without destructive failure thereof. Zener diode 66 provides a substantially square wave triggering pulse for the gate of an SCR terminal 71 and limits the voltage to capacitor 58 to 5 volts. Capacitor 58 is preferably a 10 microfarad 25 volt non-polarized capacitor which serves in conjunction with diode 66 to pass a limited amount of energy slightly above the threshold value of energy required to trigger the gate of most SCRs. As a result, regardless the power level of the SCR under test connected to terminals 71, 30 and 52, that is, regardless the internal impedance of a particular SCR under test, the limited energy available by the Zener diode 66 storage capacitor 58 circuit prevents destructive failure of any SCR whose internal impedance is unknown. In this manner, the dissipation of energy through the device cathode and gate electrodes is limited by the limited energy supplied.

In operation, an SCR is inserted into a suitable socket or other connecter member, not shown, with its cathode to terminal 52, its gate to terminal 71 and the anode to terminal 30. The type of device will determine whether or not the voltage $V_3$, $V_4$ or $V_5$ is connected across the cathode and anode electrodes by switch $S_{4a}$. Further, additional current limiting resistances (or capacitive reactance) 72 and 74 may be switched into the gate circuit by switch $S_{4b}$. That is, for low voltage devices with the anode-cathode voltage of $V_5$, a maximum current limiting resistance (or capacitance) 72 is included in the gate circuit by setting of the ganged switches $S_{4a}$ and $S_{4b}$. Assuming for the moment that the cathode and anode terminals of the SCR can be distinguished from the gate electrode, but cannot be identified as to which electrode is the cathode and which electrode is the anode, the apparatus of the present invention determines not only if the device under test is acceptable but the polarity, and thus, which terminal or electrode is a cathode and which electrode is the anode.

With the slider 70 of switch $S_5$ in the position, as shown, a positive trigger is applied via terminal 71 to the gate of the SCR. With the slider 44 of switch $S_3$ in the position shown, negative going pulses are applied to terminal 52 with respect to terminal 30. Switch $S_1$ is closed, applying power to the test circuit. Assuming the device is a moderately powered device, the voltage $V_4$ is applied across the anode and cathode terminals through switch $S_{4a}$ positioned as shown, connecting terminal 40 to terminal 34. Switch $S_{4b}$ is also positioned, as shown, connecting terminal 71 to resistance 74 through switch $S_{2b}$ to terminal 62. To commence the test, switches $S_{2a}$ and $S_{2b}$ are simultaneously closed. As a result, positive pulses of limited predetermined energy are applied to terminal 71. Also, terminal 30 is more positive with respect to terminal 52. As a result, if light bulb 32 turns on, it is apparent that the electrode of the SCR connected to terminal 30 is the anode and the electrode connected to terminal 52 is the cathode of the device under test.

The gate triggering signal applied to terminal 71 thereafter is removed by releasing switches $S_{2a}$ and $S_{2b}$. At this time the device should turn off due to the pulsating current applied between terminals 52 and 30. If the device continues to conduct by the continual indication given by the light bulb 32, then the device has failed. If upon pressing switches $S_{2a}$ and $S_{2b}$, light bulb 32 does not go on, then it is possible that the anode electrode is connected to terminal 52 and the cathode is connected to terminal 30. To determine whether this is the case, the slider 44 of the polarity reversing switch $S_3$ is reset so as to reverse the polarity of the signal applied between terminals 52 and 30. Upon depressing switches $S_{2a}$ and $S_{2b}$ and closing these switches, if the light bulb 32 still does not go on, then an open SCR is indicated. If the light bulb 32 does in fact go on, then a good device is indicated provided, of course, again, that the bulb does extinguish upon the opening of switches $S_{2a}$ and $S_{2b}$.

It is possible that the SCR device under test is one responsive to a negative trigger at the gate 71 rather than a positive trigger as assumed above. In cases where the SCR under test has not tested following the above procedure as acceptable, a further operation is required. Slider 70 of switch $S_5$ is positioned in the second position, reversing the direction of the diode 68 between terminals 62 and 64, thus, reversing the trigger applied to terminal 71. The closing of switches $S_{2a}$ and $S_{2b}$ now provides a negative trigger to the gate terminal 71. The procedure outlined above again is followed with respect to applying the polarized signal between terminals 52 and 30 via switch $S_3$.

Diacs may be tested by connection of the electrodes thereof at terminals 52 and 30. On closing the switch $S_1$, and A.C. signal is applied through the Diac when the slider 44 of switch $S_3$ is placed in the lowermost position by the connection of lead 47 between terminals 40 and 42, providing an A.C. connection between the alternating current voltage source and the terminal 52. In this case, the Diac should continuously conduct and, therefore, light bulb 32 should remain on. If the Diac tends to conduct only for one polarity of the A.C. signal, then the light bulb 32 may flicker. To determine in which direction the Diac is conducting, the slider 44 of switch $S_3$ is set to polarize the signal applied between terminals 52 and 30. The failure of the Diac is readily determined according to the set positions of the switch $S_3$ at which no conduction is indicated by the bulb 32.

Triacs are tested by connecting the gate electrode to terminal 71 and the main electrodes to terminals 52 and 30, respectively. With direct coupling of the A.C. signal to terminal 52, the Triac should indicate continuous conduction by bulb 32 with both a negative and positive pulse applied to terminal 71. Should a failure to conduct upon the application of either of the polarized pulses to terminal 71 be apparent, then a defective triac is indicated. Also, a polarized signal can be applied by switch $S_3$ to terminal 52 to determine conduction in either direction when the gate electrode is triggered through the signal applied to terminal 71.

The values of the components in one embodiments built and operated in accordance with the present invention are as follows:

| Resistances | | |
|---|---|---|
| 28 | 750 Ω | |
| 36 | 200 Ω | |
| 56 | 250 Ω | |
| 72 | 1000 Ω | or 3 mfd if capacitance |
| 74 | 33 Ω | or 10 mfd if capacitance |
| Diode 50 | IN 4007 | |
| Diode 68 | IN 4002 | |
| Diode 66 | 5.IV, 5W Zener | |
| Capacitor 58 | 10 mfd, 25 V | |

What is claimed is:

1. A tester for thyristor semiconductor devices having two main electrodes and a control electrode, comprising,
   first, second, third terminals adapted to be connected respectively to said main electrodes and said control electrode,
   a power source,
   means including first switch means connected between said source and one of said first and second terminals for selectively providing direct current or alternating current and for setting the voltage value of electrical energy provided from said source to said first and second terminals, conductor means connecting the power source to the other of said first and second terminals,
   pulse source means,
   second switch means connecting said pulse source means to said third terminal for selectively (i) setting the pulse current direction and (ii) generating a trigger pulse of electrical energy to said third terminal, said selectively generated trigger pulse having a substantially instantaneous rise time and an exponential fall time based on time constant $\tau$ such that $\tau<<T$, where $T$ is the pulse period, and
   indicating means connected in the path of the power source to indicate the presence of current flow between said first and second terminals according to the acceptable operating parameters of the particular device under test.

2. The tester of claim 1 wherein said second switch means includes pulse differentiating means connected between said pulse source means and said third terminal for limiting the magnitude of the electrical energy applied to said third terminal, said period T having a value of at least about 50 times greater than the value of the time constant $\tau$.

3. The tester of claim 2 wherein said pulse differentiating means includes a Zener diode coupled to a capacitor, said capacitor being serially connected between said source and said third terminal.

4. The tester of claim 3 wherein said second switch means includes a diode, and means for selectively determining the current conducting direction of said diode relative to said third terminal.

5. The tester of claim 1 wherein said second switch means includes a plurality of impedances of different values selectively connected between said source and said third terminal for selectively determining the value of the ratio of $\tau/T$, and a Zener diode coupled to said third terminal.

6. The tester of claim 1 wherein said first switch means includes a diode, and means for selectively determining the current conducting direction of said diode relative to said one of said first and second terminals.

7. The tester of claim 6 wherein said first switch means includes a further switch means connected between said source and said means for selectively determining the current conducting direction for selectively setting said voltage value at any of a plurality of different magnitudes.

* * * * *